(12) United States Patent
Hajaj

(10) Patent No.: US 10,837,919 B2
(45) Date of Patent: Nov. 17, 2020

(54) SINGLE CELL SCATTEROMETRY OVERLAY TARGETS

(71) Applicant: KLA-Tencor Corporation, Milpitas, CA (US)

(72) Inventor: Eitan Hajaj, Tel Aviv (IL)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/140,295

(22) Filed: Sep. 24, 2018

(65) Prior Publication Data
US 2019/0137412 A1    May 9, 2019

Related U.S. Application Data

(60) Provisional application No. 62/582,276, filed on Nov. 6, 2017.

(51) Int. Cl.
| | |
|---|---|
| *G01N 21/95* | (2006.01) |
| *G03F 7/20* | (2006.01) |
| *G01N 21/956* | (2006.01) |

(52) U.S. Cl.
CPC ....... *G01N 21/9501* (2013.01); *G01N 21/956* (2013.01); *G03F 7/70625* (2013.01); *G03F 7/70633* (2013.01)

(58) Field of Classification Search
CPC .............. G01N 21/9501; G01N 21/956; G03F 7/70625; G03F 7/70633

(Continued)

(56) References Cited

U.S. PATENT DOCUMENTS

| 7,564,555 B2 * | 7/2009 | Den Boef ........... G03F 7/70633 356/401 |
| 2005/0018190 A1 * | 1/2005 | Sezginer ............ G03F 7/70633 356/401 |

(Continued)

FOREIGN PATENT DOCUMENTS

WO    2017147261 A1    8/2017

OTHER PUBLICATIONS

Adel, M. et al., "Diffraction order control in overlay metrology—a review of the roadmap options", 2008, SPIE vol. 6922, 692202-1-692202-19.

(Continued)

*Primary Examiner* — Isiaka O Akanbi
(74) *Attorney, Agent, or Firm* — Suiter Swantz pc llo

(57) ABSTRACT

Scatterometry overlay (SCOL) single cell targets are provided, along with target design methods and measurement methods which employ the single cell SCOL targets for in-die metrology measurements, utilizing the small size of the target along with maintained optical performance due to the design of the target. Disclosed single cell targets comprise a lattice of elements at two or more layers which is periodic two or more measurement directions. Elements in different layers are offset with respect to each other and may have the same pitch along the measurement directions. Measurement algorithms are also provided to derive metrology measurements such as overlays from the single cell targets, possibly simultaneously in both (or more) measurement directions, reducing measurement time and enhancing the metrology throughput. Positioning the small targets in-die provides more accurate metrology results which are less sensitive to process variation.

20 Claims, 6 Drawing Sheets

(58) Field of Classification Search
USPC .................................................. 356/399–401
See application file for complete search history.

(56) References Cited

U.S. PATENT DOCUMENTS

| | | | |
|---|---|---|---|
| 2005/0195398 A1* | 9/2005 | Adel | ...................... B82Y 10/00 |
| | | | 356/401 |
| 2009/0279091 A1 | 11/2009 | Levinski et al. | |
| 2010/0091284 A1 | 4/2010 | Mieher et al. | |
| 2014/0351771 A1* | 11/2014 | Amir | ................... G03F 7/70633 |
| | | | 716/50 |
| 2015/0204664 A1 | 7/2015 | Bringoltz et al. | |
| 2015/0219449 A1* | 8/2015 | Bringoltz | ............ G03F 7/70633 |
| | | | 356/614 |
| 2015/0227675 A1 | 8/2015 | Amir et al. | |
| 2015/0323471 A1* | 11/2015 | Sapiens | .............. G01N 21/9501 |
| | | | 356/73 |
| 2016/0178351 A1 | 6/2016 | Amit et al. | |
| 2016/0253450 A1* | 9/2016 | Kandel | ................... H01L 22/30 |
| | | | 356/401 |
| 2016/0266505 A1 | 9/2016 | Amit et al. | |

OTHER PUBLICATIONS

International Search Report dated Feb. 21, 2019 for PCT/US2018/058063.

\* cited by examiner

*200*

- 210 — DESIGNING A SINGLE CELL SCOL TARGET
- 220 — ARRANGING TARGET ELEMENTS IN A LATTICE, IN AT LEAST TWO LAYERS, WITH OFFSETS BETWEEN ELEMENTS IN DIFFERENT LAYERS ALONG TWO OR MORE MEASUREMENT DIRECTIONS
- 230 — DESIGNING THE PITCHES TO BE EQUAL ALONG THE MEASUREMENT DIRECTIONS
- 240 — POSITIONING THE SINGLE CELL TARGETS IN-DIE
- 250 — MEASURING THE SINGLE CELL SCOL TARGET
- 260 — MEASURING DIFFERENTIAL SIGNALS FROM THE SINGLE CELL SCOL TARGET, SIMULTANEOUSLY ALONG TWO OR MORE MEASUREMENT DIRECTIONS
- 270 — DERIVING OVERLAY ESTIMATIONS FOR THE TWO OR MORE MEASUREMENT DIRECTIONS FROM THE MEASURING DIFFERENTIAL SIGNALS

FIG.3

SINGLE CELL SCATTEROMETRY OVERLAY TARGETS

CROSS-REFERENCE TO RELATED APPLICATION

The present application claims the benefit under 35 U.S.C. § 119(e) of U.S. Provisional Application Ser. No. 62/582,276, filed Nov. 6, 2017, entitled SINGLE CELL SCATTEROMETRY OVERLAY TARGETS, naming Eitan Hajaj as inventor, which is incorporated herein by reference in the entirety.

BACKGROUND OF THE INVENTION

1. Technical Field

The present invention relates to the field of metrology, and more particularly, to scatterometry overlay metrology targets.

2. Discussion of Related Art

Prior art overlay metrology measurements are performed in the scribe lines between dies or fields of the wafer, far away from the devices for which they are used to provide metrology data—mainly due to real-estate considerations, such as available area on the wafer with respect to target size.

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides a scatterometry overlay (SCOL) target comprising a single cell with a lattice of elements at least at two layers wherein: the lattice is periodic along at least two measurement directions, and the elements at one of the layers are offset with respect to the elements in another one of the layers along the at least two measurement directions.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIG. 3 is a high-level flowchart illustrating SCOL target design and measurement methods, according to some embodiments of the invention.

DETAILED DESCRIPTION OF THE INVENTION

Figure 1:
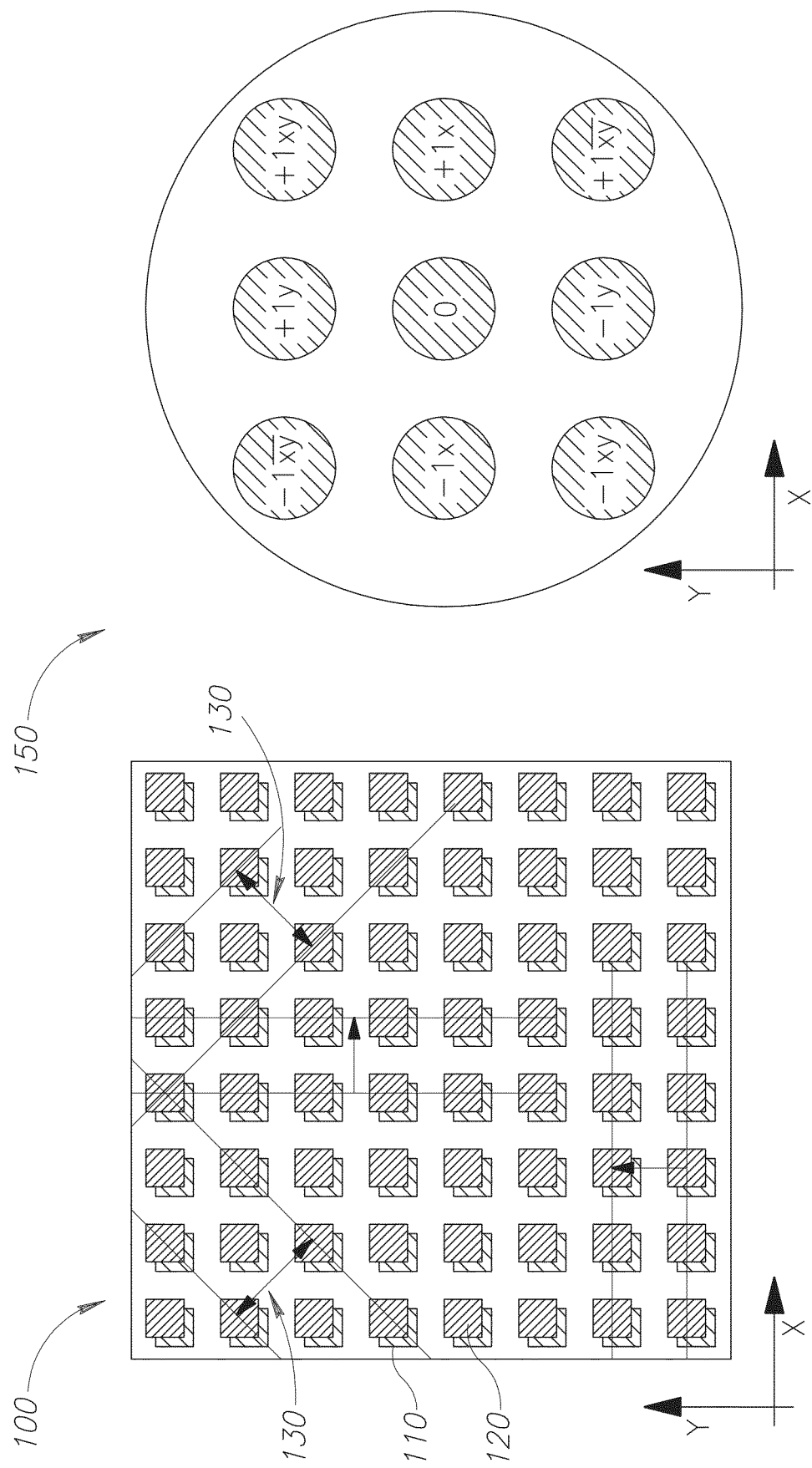
FIG. 1 is a high level schematic illustration of a single cell SCOL target and a corresponding pupil image thereof, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing", "deriving" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention provide efficient and economical methods, mechanisms and targets for implementing in-die measurement and thereby provide improvements to the technological field of scatterometry metrology. Disclosed are single-cell scatterometry overlay measurement targets having small enough size to allow in-die overlay measurement—which in turn improves the correspondence in metrology parameters such as overlay between the metrology target and the relevant devices on the wafer.

Prior art scatterometry overlay (SCOL) targets typically have at least four cells, typically in a 2×2 cell array with 8×8 μm for each cell and a standard target size of 16×16 μm². Each cell typically comprises periodic structures at least at two wafer layers, which are offset with respect to each other in the respective measurement direction (X and Y, two cells are designed for each direction). Corresponding pupil images used for measuring the metrology parameters (such as overlay) include −1, 0 and +1 diffraction orders in each direction. Typical SCOL algorithms calculate, for each direction, a differential signal for each cell—($D_{cell} = I_{cell}^{+1} - I_{cell}^{-1}$), and a corresponding overlay ε from the calculated signals:

$$\varepsilon = \frac{D_1 + D_2}{D_1 - D_2} f_0$$

—with $D_1$, $D_2$ denoting the differential signals for the two cells of each direction, and $f_0$ denoting an induced shift between the "Bottom" and "Top" periodic structure in the different layers (e.g., by design, the "Top" periodic structure may be shifted with respect to the "Bottom" periodic structure by $+f_0$ and $-f_0$ in cells 1 and 2, respectively).

Disclosed embodiments overcome several limitations of prior art targets and metrology procedures, related to the distance between prior art targets and devices as well as to the reduction in cell size which is related to the shrinking node sizes in advanced photolithography processes. For example, due to the optical constrains of the measurement method, reduction of the cell size may significantly increase the measurement noise due to mixing of the cell edge (non-periodic behavior) signal with the cell center signal (the desired signal). Other effects of the cell size reduction are due to the loss of the infinite approximation of the measurement algorithms. In recent semiconductor manufacturing nodes, high order corrections to the overlay models have become very popular due to the significant reduction in the allowed inaccuracy budget. These complicated models require a higher number of sampling points both across the wafer and within the fields. A significant portion of the measurement tool throughput and usage time are due to the need to effectively measure each target four times (measurements of two cells in each of the two directions, X and Y).

Scatterometry overlay (SCOL) single cell targets are provided, along with target design methods and measurement methods which employ the single cell SCOL targets for in-die metrology measurements, utilizing the small size of the target along with maintained optical performance due to the design of the target. Disclosed single cell targets comprise a lattice of elements at two or more layers which is periodic along two or more measurement directions (such as the lattice vectors). The elements at one of the layers are offset with respect to the elements in another one of the layers along the measurement directions. The elements may have the same pitch along the measurement directions. Measurement algorithms are also provided to derive metrology measurements such as overlays from the single cell targets, possibly simultaneously in both (or more) measurement directions, reducing measurement time and enhancing the metrology throughput. Positioning the small targets in-die provides more accurate metrology results which are less sensitive to process variation.

FIG. 1 is a high level schematic illustration of a single cell SCOL target 100 and a corresponding pupil image 150 thereof, according to some embodiments of the invention.

Figure 2:
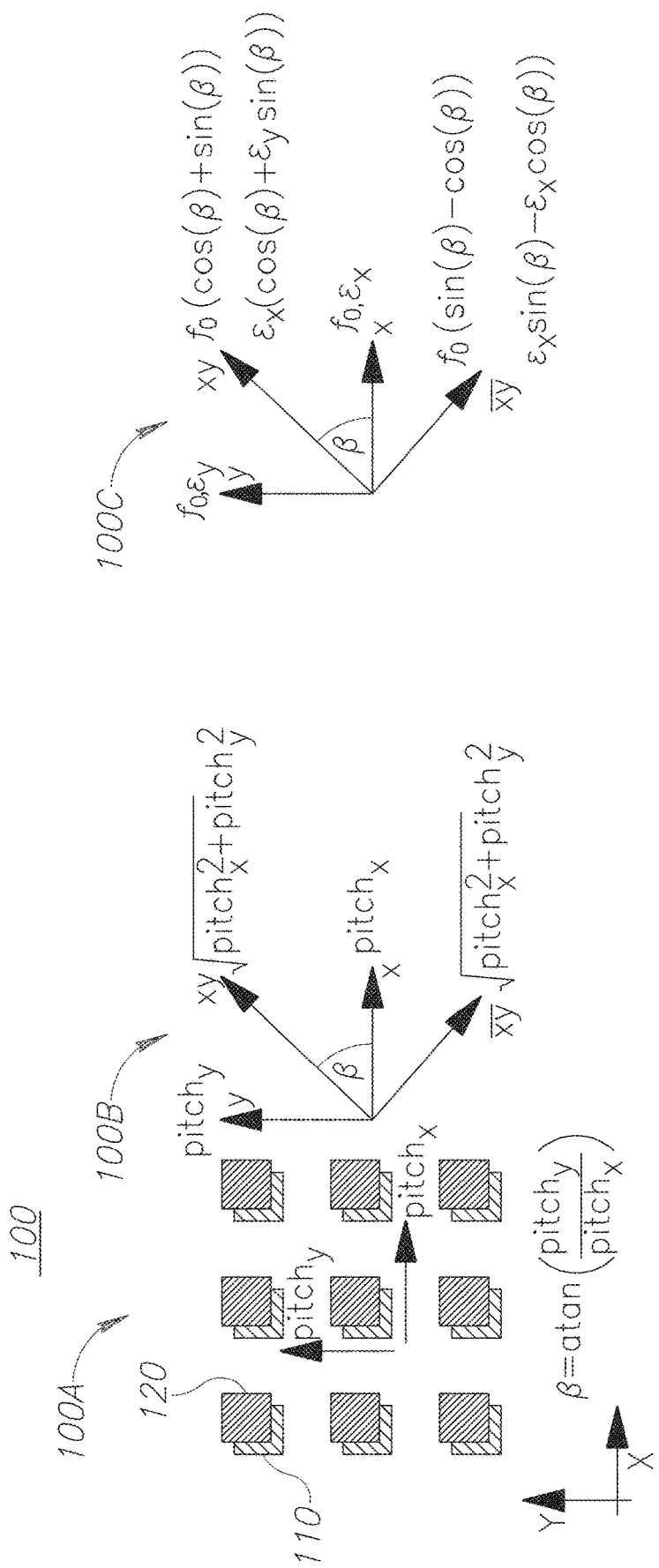
FIG. 2 is a high level schematic illustration of the periodicities and configuration of the single cell SCOL target, according to some embodiments of the invention.

FIG. 2 is a high level schematic illustration of the periodicities and configuration of single cell SCOL target 100, according to some embodiments of the invention.

Disclosed SCOL targets comprise a single cell with a lattice of elements 110, 120 at least at two layers, referred to as bottom and top layer, respectively. The lattice is periodic along at least two measurement directions (denoted X and Y as orthogonal directions, in a non-limiting manner), and elements at one of the layers are offset with respect to the elements in another one of the layers (denoted as top layer elements 120 with respect to bottom layer elements 110, in a non-limiting manner) along the at least two measurement directions. The periodicity of elements 110, 120 in the respective layers is indicated by the respective pitches (Pitch$_x$, Pitch$_y$; or $P_x$, $P_y$). Offsets $f_0$ between top layer elements 120 with respect to bottom layer elements 110 have components along all at least two measurement directions, in the illustrated non-limiting example ($f_{0x}$, $f_{0y}$, or $f_0 \cdot \cos \beta$, $f_0 \cdot \sin \beta$ with β denoting the angle between the offset and one of the measurement directions, X in the illustrated case). In the illustrated example elements 110, 120 are rectangular, yet other forms of elements 110, 120 may be implemented. Elements 110, 120 may be configured to be with a periodicity of 0.5-1 μm or bigger with duty cycle of between 10% and 90%. Single cell targets 100 may be configured to be 10 μm or smaller, possibly 8 μm or smaller, enabling in-die implementation.

SCOL targets 100 may comprise two-directionally (2D) segmented SCOL targets which enable measurement in both directions (vertical and horizontal) at the same time using a single cell measurement. In addition to the signals in the vertical and horizontal directions, there are also signals from the diagonal lattices, which can also be used for the overlay calculations. In FIG. 1, pupil image 150 is shown schematically as having diffraction orders −1, 0, +1 in both directions X and Y, as well as optionally (with respect to pupil image size and configuration) diagonal diffraction orders ±xy and $\pm\overline{xy}$ for corresponding directions. It is noted that diagonal lattices, corresponding to further lattice vectors may also be measured (measurement directions may comprise two, three or more lattice vectors), as indicated schematically by respective pitches in the image of SCOL target 100 in FIG. 1 (see diagonal directions and pitches denoted by arrow 130).

Any of elements 110 and/or 120 of SCOL targets 100 may be subdivided with finer, typically unresolved, pitches to improve process compatibility. Spaces between elements 110 and/or 120 of SCOL targets 100 may be filled (dummy fill) with fine, typically unresolved, features to enhance robustness. These subdivisions are not illustrated yet are applicable to any of the embodiments. The dummy fill may be implemented using various designs, such as any of: CD modulation (see e.g., U.S. Application Publication No. 20150227675, incorporated herein by reference in its entirety), Fill Factor modulation (U.S. Provisional Application No. 62/314,086, incorporated herein by reference in its entirety) and/or Fully segmented (U.S. application Ser. No. 14/949,444, incorporated herein by reference in its entirety).

Certain embodiments comprise target design file of SCOL targets 100. Certain embodiments comprise wafer(s) comprising multiple SCOL targets 100, positioned in-die. Certain embodiments comprise SCOL measurements of SCOL targets 100.

FIG. 3 is a high-level flowchart illustrating SCOL target design and measurement methods 200, according to some embodiments of the invention. The method stages may be carried out with respect to SCOL targets 100 described above, which may optionally be configured to implement method 200. Method 200 may comprise the following stages, irrespective of their order. Certain embodiments comprise SCOL target design methods 210 which comprise arranging target elements with offsets between elements in different layers along two or more measurement directions (stage 220), designing pitches of the lattice elements to be equal along the two or more measurement directions (stage 230) and positioning the designed single cell SCOL target in-die (stage 240). Certain embodiments comprise SCOL measurement methods 250 comprising measuring differential signals from SCOL targets 100, simultaneously along the at least two measurement directions (stage 260), and deriving therefrom overlay estimations along the at least two measurement directions (stage 270). Method 200 may be at least partially implemented by at least one computer processor, e.g., in a metrology module. Certain embodiments comprise computer program products comprising a computer readable storage medium having computer readable program embodied therewith and configured to carry out the relevant stages of method 200. Certain embodiments comprise target design files of respective targets designed by embodiments of method 200.

The differential signal between the +1 diffraction order and the −1 diffraction order may be expressed and approximated according to Equation 1, with D denoting the differential signal, I denoting the signal intensity, Δ denoting the shifts between elements 110 and 120 in the corresponding layers (the shifts include induced offsets $f_0$ and the overlays ε that are to be estimated), $A_k$ being complex coefficients which depend on wavelength, incident angles, target pitch and target topography parameters, and $B=2\pi A_1/\text{Pitch}$. The approximation is for small illumination angles, similar to the assumption in current scatterometry overlay algorithms, such as in Adel et al. 2008, Diffraction order control in overlay metrology—a review of the roadmap options, SPIE Vol. 6922 692202-15:

$$D = I^{(n)} - I^{(-n)} =$$
$$\sum_{k=1}^{\infty} A_k \sin\left(\frac{2k\pi}{\text{Pitch}}\Delta\right) \approx A_1 \sin\left(\frac{2\pi}{\text{Pitch}}\Delta\right) \approx \frac{2\pi A_1}{\text{Pitch}}\Delta = B\Delta \quad \text{Equation 1}$$

From Equation 1, the differential signals $D_x$, $D_y$, $D_{xy}$, $D_{\overline{xy}}$ (see the definition of the directions in FIG. 2) in the non-limiting example illustrated in FIGS. 1 and 2 can be expressed as in Equations 2.

$$D_x = (\varepsilon_x + f_0)B_x; D_y = (\varepsilon_y + f_0)B_y$$

$$D_{xy} = (\varepsilon_x \cos(\beta) + \varepsilon_y \sin(\beta) + f_0(\cos(\beta) + \sin(\beta)))B_{xy}$$

$$D_{\overline{xy}} = (\varepsilon_x \sin(\beta) - \varepsilon_y \cos(\beta) + f_0(\sin(\beta) - \cos(\beta)))B_{\overline{xy}} \quad \text{Equations 2}$$

For equal pitches along the at least two measurement directions (in the illustrated example, $P_x=P_y$) the following notation, provided in Equations 3, may be applied for any given target topography (wavelength and incident angles are identical in any case):

$$Pitch_y = Pitch_x \rightarrow Pitch_{xy} = Pitch_{\overline{xy}} = \sqrt{2}\, Pitch_x \quad \text{Equation 3}$$

-continued $$B_y = B_x, B_{\overline{xy}} =$$
$$B_{xy} \text{ and } \beta = a\tan\left(\frac{Pitch_y}{Pitch_x}\right) = \frac{\pi}{4} \rightarrow \cos(\beta) = \sin(\beta) = \frac{\sqrt{2}}{2}$$

The notations provided by Equations 3, used in Equations 2, provides the expressions for the differential signals of Equations 4:

$$D_x = (\varepsilon_x + f_0)B_x; D_y = (\varepsilon_y + f_0)B_x \quad \text{Equation 4}$$
$$D_{xy} = \frac{\sqrt{2}}{2}(\varepsilon_x + \varepsilon_y + 2f_0)B_{xy}; D_{\overline{xy}} = \frac{\sqrt{2}}{2}(\varepsilon_x - \varepsilon_y)B_{xy}$$

From Equations 4, the expressions for the overlays along the measurement directions, $\varepsilon_x$ and $\varepsilon_y$, may be derived as expressed in Equations 5:

$$\frac{D_x + D_y}{D_x - D_y} = \quad \text{Equation 5}$$

$$\frac{\varepsilon_x + \varepsilon_y + 2f_0}{\varepsilon_x - \varepsilon_y} \rightarrow f_0 = \varepsilon_x\left(\frac{D_y}{D_x - D_y}\right) - \varepsilon_y\left(\frac{D_x}{D_x - D_y}\right)$$

$$\frac{D_{xy} + D_{\overline{xy}}}{D_{xy} - D_{\overline{xy}}} = \frac{\varepsilon_x + f_0}{\varepsilon_y + f_0} \rightarrow \varepsilon_x - \frac{D_{xy} + D_{\overline{xy}}}{D_{xy} - D_{\overline{xy}}}\varepsilon_y =$$

$$\frac{2D_{\overline{xy}}}{D_{xy} - D_{\overline{xy}}}f_0 \rightarrow \varepsilon_x = \frac{2D_{\overline{xy}}}{D_{xy} - D_{\overline{xy}}}f_0 + \frac{D_{xy} + D_{\overline{xy}}}{D_{xy} - D_{\overline{xy}}}\varepsilon_y$$

$$\varepsilon_y = \frac{D_x D_{xy} - D_x D_{\overline{xy}} - D_y D_{xy} - D_y D_{\overline{xy}}}{D_{xy}D_y + D_y D_{\overline{xy}} - D_x D_{xy} + D_x D_{\overline{xy}}} f_0$$

$$\varepsilon_x = -\frac{D_x D_{xy} - D_x D_{\overline{xy}} + D_y D_{xy} - D_y D_{\overline{xy}}}{D_{xy}D_y + D_y D_{\overline{xy}} - D_x D_{xy} + D_x D_{\overline{xy}}} f_0$$

The overlay estimations $\varepsilon_x$ and $\varepsilon_y$ along the measurement directions may be calculated per pixel across the pupil plane, and additional derivations, approximations and simulation techniques may be applied from the prior art to disclosed targets 100.

In certain embodiments, e.g., having a cut layer as part of the process flow, disclosed targets 100 and methods 200 may be used to derive overlay estimations $\varepsilon_x$ and $\varepsilon_y$ for different layers (e.g., an original layer and a cut layer, two different cut layers in opposite orientations, etc.) is such a way, that the overly estimation for one direction (x or y) may be suggestive of one layer while the overly estimation for the other direction is suggestive to the other layer.

Advantageously, disclosed SCOL target 100 may be designed to be much smaller than prior art SCOL targets, as they are composed of a single cell, e.g., disclosed SCOL target 100 may require ¼ of the area (real estate) prior art four-cell SCOL targets do, without reduction of the cell size—to provide comparable target performance (e.g., same low noise). The smaller area allows for placing SCOL targets 100 in-die, in proximity to the devices, rather than prior art positions in the scribe lines—to increase the accuracy of the metrology measurements and possibly reduce the acquisition time of the targets. Using in-die single cell SCOL targets 100 also reduces or eliminates the risk of pad-to-pad variations—since only one cell is measured there are no errors due to variations in the stack between the two cells (per-direction), fluctuations in the light source, or due to cell centering differences. Moreover, the measurement time of disclosed SCOL targets 100 may be much shorter than of prior art SCOL targets, e.g., measuring disclosed SCOL target 100 may require ¼ of the time prior art four-cell SCOL targets do, allows for a higher sampling without reducing the throughput and/or for a higher throughput.

Figure 4A:
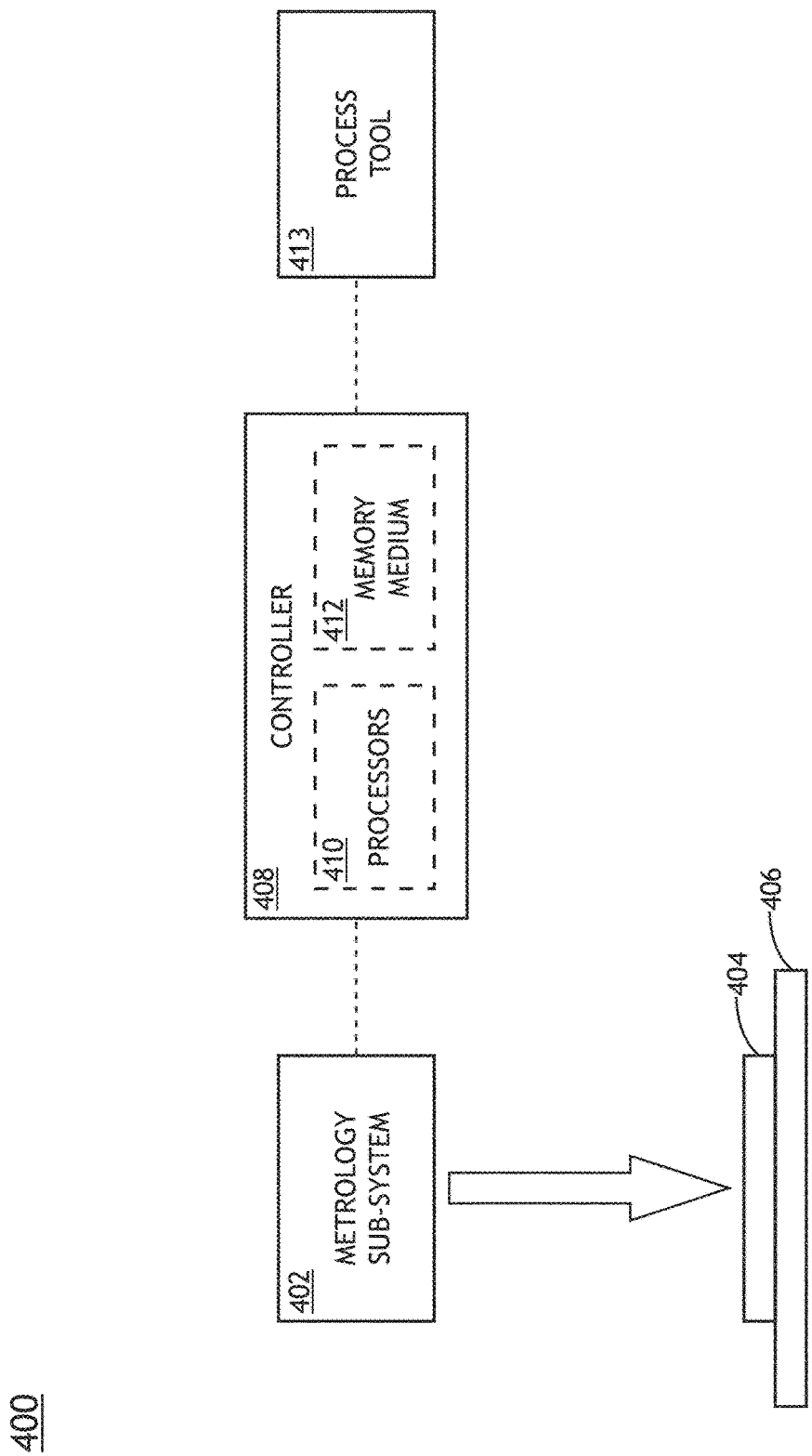
FIG. 4A illustrates a high-level schematic illustration of a metrology system, according to some embodiments of the invention.
Figure 4B:
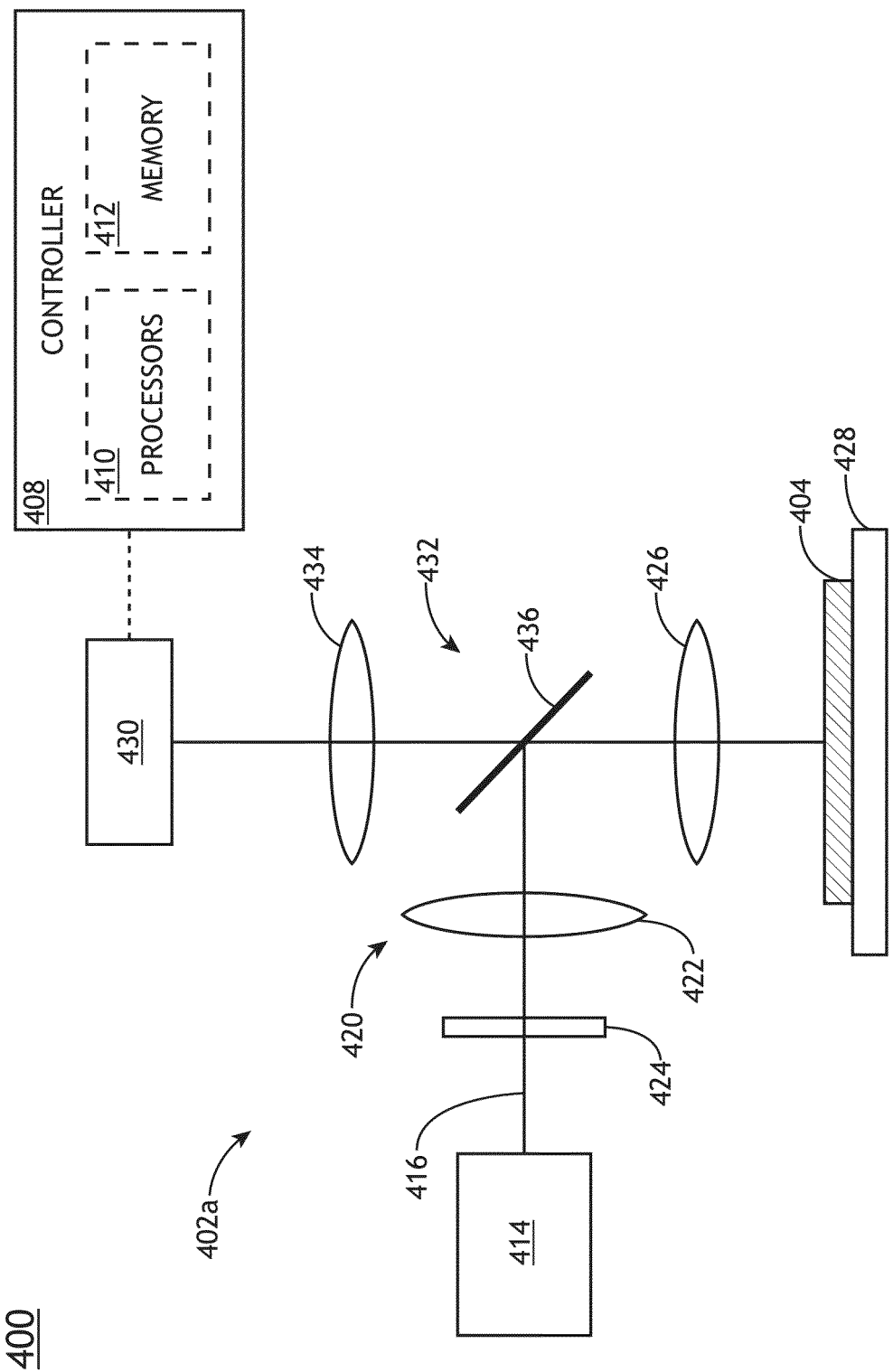
FIG. 4B illustrates a high-level schematic illustration of an optical metrology sub-system of the metrology system, according to some embodiments of the invention.
Figure 4C:
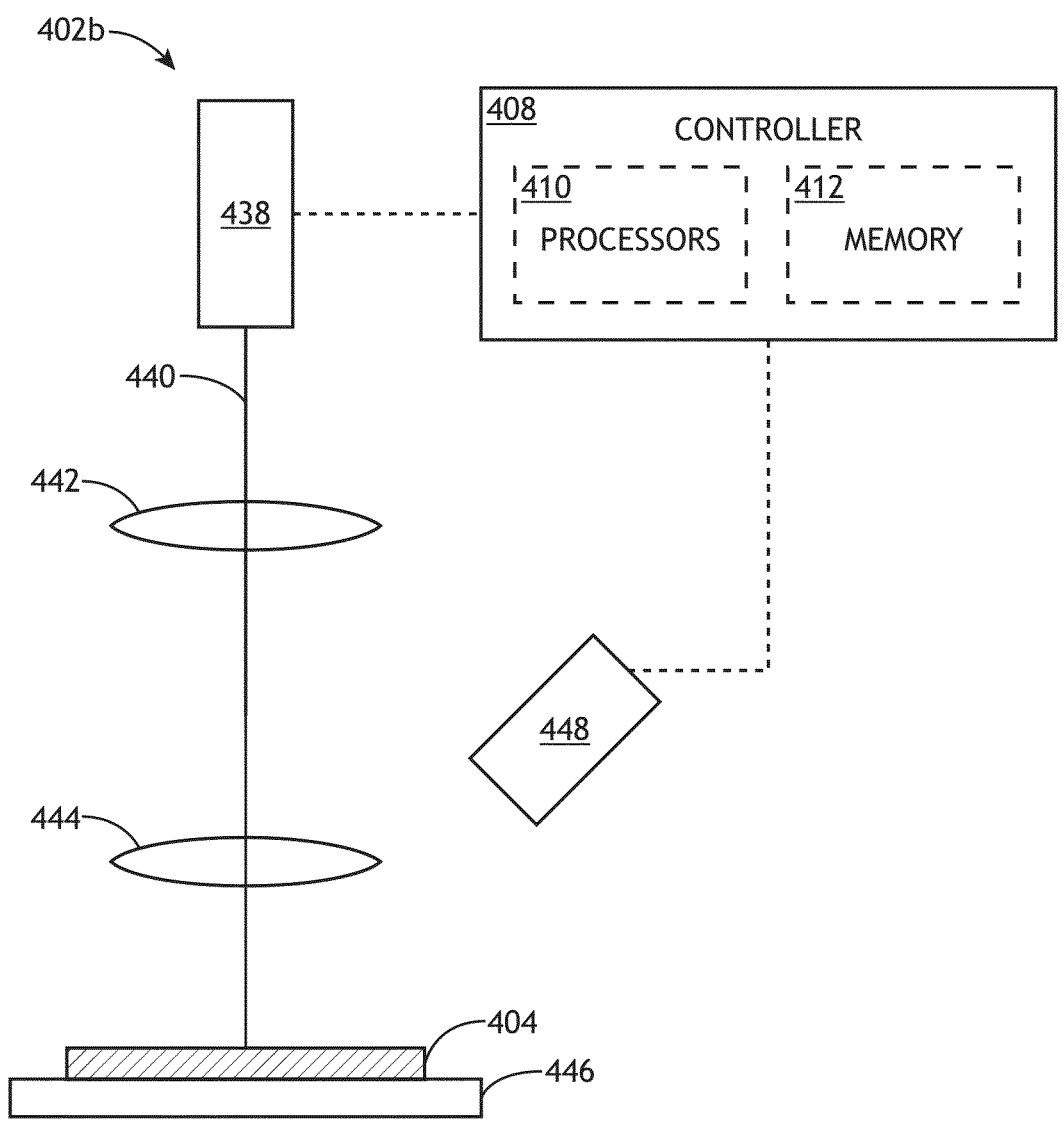
FIG. 4C illustrates a high-level schematic illustration of particle-beam metrology sub-system of the metrology system, according to some embodiments of the invention.

FIGS. 4A-4C illustrates a metrology system 400, in accordance with one or more embodiments of the present disclosure. The metrology system 400 may be configured to carry out any of the various embodiments described previously herein and may measure metrology parameters from any of the various metrology targets described herein. In one embodiment, the overlay metrology system 400 includes a metrology sub-system 402, or tool, suitable for generating overlay measurements based on optically-resolvable features. In another embodiment, the sample 404 is disposed on a sample stage 406.

In another embodiment, the metrology system 400 includes a controller 408. The controller 408 may include one or more processors 410 configured to execute program instructions maintained on a memory medium 412. In this regard, the one or more processors 410 of controller 408 may execute any of the various process steps described throughout the present disclosure. For example, the controller 408 may receive data from any of the optical metrology sub-system 402a and may generate overlay correctables based on data from the optical metrology tool 402.

Further, the controller 408 may be communicatively coupled to one or more semiconductor process or fabrication tools 413 such as, but not limited to, a lithography tool. In this regard, the controller 408 may utilize the various outputs described previous herein to make adjustments to the process tool configuration, which in turn performs adjustments on one or more semiconductor wafers being fabricated on the fabrication line. For example, the controller 408 may operate as a process controller suitable for controlling the inputs of the process tool to maintain overlay in semiconductor devices fabrication on a fabrication line within selected overlay tolerances. The overlay correctables may be provided as part of a feedback and/or a feedforward control loop. In one embodiment, the overlay measurements associated with a current process step measured on a sample are used to compensate for drifts of one or more fabrication processes and may thus maintain overlay within selected tolerances across multiple exposures on subsequent samples in the same or different lots. In another embodiment, the overlay measurements associated with a current process step may be fed-forward to adjust subsequent process steps to compensate for any measured overlay errors. For example, the exposure of patterns on subsequent layers may be adjusted to match the measured overlay of the subsequent layers. In another embodiment, overlay measurements of a current process step may be fed-backward to the metrology system 400 itself to improve or enhance the metrology process on subsequent layers.

The one or more processors 410 of a controller 408 may include any processing element known in the art. In this sense, the one or more processors 410 may include any microprocessor-type device configured to execute algorithms and/or instructions. In one embodiment, the one or more processors 410 may consist of a desktop computer, mainframe computer system, workstation, image computer, parallel processor, or any other computer system (e.g., networked computer) configured to execute a program configured to operate the overlay metrology system 400, as described throughout the present disclosure. It is further recognized that the term "processor" may be broadly defined to encompass any device having one or more processing elements, which execute program instructions from a non-transitory memory medium 412. Further, the steps described throughout the present disclosure may be carried out by a single controller 408 or, alternatively, multiple controllers. Additionally, the controller 408 may include one or more controllers housed in a common housing or within multiple housings. In this way, any controller or combination of controllers may be separately packaged as a module suitable for integration into overlay metrology system 400.

The memory medium 412 may include any storage medium known in the art suitable for storing program instructions executable by the associated one or more processors 410. For example, the memory medium 412 may include a non-transitory memory medium. By way of another example, the memory medium 412 may include, but is not limited to, a read-only memory, a random access memory, a magnetic or optical memory device (e.g., disk), a magnetic tape, a solid state drive, and the like. It is further noted that memory medium 412 may be housed in a common controller housing with the one or more processors 410. In one embodiment, the memory medium 412 may be located remotely with respect to the physical location of the one or more processors 410 and controller 408. For instance, the one or more processors 410 of controller 408 may access a remote memory (e.g., server), accessible through a network (e.g., internet, intranet, and the like). Therefore, the above description should not be interpreted as a limitation on the present invention but merely an illustration.

Referring now to FIG. 4B, in one embodiment, the metrology system 400 includes an optical metrology sub-system 402a. The optical metrology sub-system 402a, or tool, may include any type of optical overlay metrology tool known in the art suitable for generating overlay data associated with two or more layers of a sample such as, but not limited to, an image-based optical metrology tool or a scatterometry-based optical metrology tool.

In one embodiment, the optical metrology sub-system 402a includes an optical illumination source 414 to generate an optical illumination beam 416. The optical illumination beam 416 may include one or more selected wavelengths of light including, but not limited to, ultraviolet (UV) light, visible light, or infrared (IR) light. The optical illumination source 414 may include any type of illumination source suitable for providing an optical illumination beam 416. In one embodiment, the optical illumination source 414 is a laser source. For example, the optical illumination source 414 may include, but is not limited to, one or more narrowband laser sources, a broadband laser source, a supercontinuum laser source, a white light laser source, or the like. In this regard, the optical illumination source 414 may provide an optical illumination beam 416 having high coherence (e.g., high spatial coherence and/or temporal coherence). In another embodiment, the optical illumination source 414 includes a laser-sustained plasma (LSP) source. For example, the optical illumination source 414 may include, but is not limited to, a LSP lamp, a LSP bulb, or a LSP chamber suitable for containing one or more elements that, when excited by a laser source into a plasma state, may emit broadband illumination. In another embodiment, the optical illumination source 414 includes a lamp source. For example, the optical illumination source 414 may include, but is not limited to, an arc lamp, a discharge lamp, an electrode-less lamp, or the like. In this regard, the optical illumination source 414 may provide an optical illumination beam 416 having low coherence (e.g., low spatial coherence and/or temporal coherence).

In another embodiment, the optical illumination source 414 directs the optical illumination beam 416 to the sample 404 via an illumination pathway 420. The illumination pathway 420 may include one or more illumination pathway lenses 422 or additional optical components 424 suitable for modifying and/or conditioning the optical illumination beam 416. For example, the one or more optical components 424 may include, but are not limited to, one or more polarizers, one or more filters, one or more beam splitters, one or more diffusers, one or more homogenizers, one or more apodizers, or one or more beam shapers. The illumination pathway 420 may further include an objective lens 426 configured to direct the optical illumination beam 416 to the sample 404.

In another embodiment, the sample 404 is disposed on a sample stage 428. The sample stage 428 may include any device suitable for positioning and/or scanning the sample 404 within the optical metrology sub-system 402. For example, the sample stage 428 may include any combination of linear translation stages, rotational stages, tip/tilt stages, or the like.

In another embodiment, the optical metrology sub-system 402a includes a detector 430 configured to capture light emanating from the sample 404 through a collection pathway 432. The collection pathway 432 may include, but is not limited to, one or more collection pathway lenses 434 for collecting light from the sample 404. For example, a detector 430 may receive light reflected or scattered (e.g., via specular reflection, diffuse reflection, and the like) from the sample 404 via one or more collection pathway lenses 434. By way of another example, a detector 430 may receive light generated by the sample 404 (e.g., luminescence associated with absorption of the optical illumination beam 416 or the like). By way of another example, a detector 430 may receive one or more diffracted orders of light from the sample 404 (e.g., 0-order diffraction, ±1 order diffraction, ±2 order diffraction, and the like).

The detector 430 may include any type of detector known in the art suitable for measuring illumination received from the sample 404. For example, a detector 430 may include, but is not limited to, a CCD detector, a TDI detector, a photomultiplier tube (PMT), an avalanche photodiode (APD), or the like. In another embodiment, a detector 430 may include a spectroscopic detector suitable for identifying wavelengths of light emanating from the sample 404.

The collection pathway 432 may further include any number of optical elements to direct and/or modify collected illumination from the sample 404 including, but not limited to one or more collection pathway lenses 434, one or more filters, one or more polarizers, or one or more beam blocks.

In one embodiment, the detector 430 is positioned approximately normal to the surface of the sample 404. In another embodiment, the optical metrology sub-system 402a includes a beamsplitter 436 oriented such that the objective lens 426 may simultaneously direct the optical illumination beam 416 to the sample 404 and collect light emanating from the sample 404. Further, the illumination pathway 420 and the collection pathway 432 may share one or more additional elements (e.g., objective lens 426, apertures, filters, or the like).

The optical metrology sub-system 402a may measure overlay based on any technique known in the art such as, but not limited to, imaged-based techniques or scatterometry-based techniques. For example, the optical metrology sub-system 402a operating in an imaging mode may illuminate a portion of the sample 404 and capture an image of the illuminated portion of the sample 404 on a detector 430. The captured image may be any type of image known in the art such as, but not limited to, a brightfield image, a darkfield image, a phase-contrast image, or the like. Further, captured images may be stitched together (e.g., by the optical metrology sub-system 402a, by the controller 408, or the like) to form a composite image of the sample 404. By way of another example, the optical metrology sub-system 402a may scan a focused optical illumination beam 416 across the sample 404 and capture light and/or particles emanating from the sample 404 on one or more detectors 430 at one or more measurement angles to generate an image pixel by pixel. Accordingly, overlay associated with two or more sample layers may be determined based on the relative positions of features located on the two or more sample layers.

By way of another example, the optical metrology sub-system 402a may operate as a scatterometry-based metrology tool by determining overlay based on the pattern of light scattered and/or diffracted from the sample 404 in response to the optical illumination beam 416. For example, optical metrology sub-system 402a may capture (e.g., with the detector 430) one or more pupil plane images (e.g., of different regions of an overlay target) including the angular distribution of light emanating from the sample. Accordingly, overlay between two or more sample layers may be determined from the pupil plane images based on modeled scattering and/or diffraction from overlay target features having known sizes and distributions for each layer.

Referring now to FIG. 4C, in one embodiment, the metrology system 400 includes a particle-beam metrology sub-system 402b. The particle-beam metrology sub-system 402b may include any type of metrology tool suitable for resolving device features or device-scale features such as, but not limited to an electron-beam metrology tool (e.g., a SEM, a CD-SEM, or the like), or an ion-beam metrology tool (e.g., a focused-ion-beam (FIB) metrology tool).

In one embodiment, the particle-beam metrology sub-system 402b includes a particle source 438 (e.g., an electron beam source, an ion beam source, or the like) to generate a particle beam 440 (e.g., an electron beam, a particle beam, or the like). The particle source 438 may include any particle source known in the art suitable for generating a particle beam 440. For example, the particle source 438 may include, but is not limited to, an electron gun or an ion gun. In another embodiment, the particle source 438 is configured to provide a particle beam 440 with a tunable energy.

In another embodiment, the particle-beam metrology sub-system 402b includes one or more particle focusing elements 442. For example, the one or more particle focusing elements 442 may include, but are not limited to, a single particle focusing element or one or more particle focusing elements forming a compound system. In another embodiment, the one or more particle focusing elements 442 include a particle objective lens 444 configured to direct the particle beam 440 to the sample 404 located on a sample stage 446. Further, the one or more particle source 438 may include any type of electron lenses known in the art including, but not limited to, electrostatic, magnetic, uni-potential, or double-potential lenses.

In another embodiment, the particle-beam metrology sub-system 402b includes at least one particle detector 448 to image or otherwise detect particles emanating from the sample 404. In one embodiment, the particle detector 448 includes an electron collector (e.g., a secondary electron collector, a backscattered electron detector, or the like). In another embodiment, the particle detector 448 includes a photon detector (e.g., a photodetector, an x-ray detector, a scintillating element coupled to photomultiplier tube (PMT) detector, or the like) for detecting electrons and/or photons from the sample surface.

It is to be understood that the description of a particle-beam metrology sub-system 402b as depicted in FIG. 4C and the associated descriptions above are provided solely for illustrative purposes and should not be interpreted as limiting. For example, the particle-beam metrology sub-system 402b may include a multi-beam and/or a multi-column system suitable for simultaneously interrogating a sample 404. In a further embodiment, the particle-beam metrology sub-system 402b may include one or more components (e.g., one or more electrodes) configured to apply one or more voltages to one or more locations of the sample 404. In this regard, the particle-beam metrology sub-system 402b may generate voltage contrast imaging data.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A scatterometry overlay (SCOL) target comprising a single cell with a lattice of elements including at least at two layers wherein:
   the lattice is periodic along at least two orthogonal measurement directions and a single diagonal direction,
   the elements in one of the layers are offset with respect to the elements in another one of the layers along the at least two orthogonal measurement directions across the lattice of elements, and
   each element in one of the layers at least partially overlaps a corresponding element in another one of the layers in the single diagonal direction across the lattice of elements,
   wherein an overlay estimation for the SCOL target is derivable from measurements of differential signals in the at least two orthogonal measurement directions and the single diagonal direction.

2. The SCOL target of claim 1, wherein the elements are arranged with corresponding pitches and offsets.

3. The SCOL target of claim 1, wherein one or more pitches of the elements along the at least two orthogonal measurement directions are equal.

4. The SCOL target of claim 1, wherein the elements are rectangular.

5. The SCOL target of claim 1, wherein the elements are 10 µm or smaller.

6. A wafer comprising:
a plurality of SCOL targets, wherein at least some of the SCOL targets comprise a single cell with a lattice of elements including at least at two layers wherein:
the lattice is periodic along at least two orthogonal measurement directions and a single diagonal direction,
the elements in one of the layers are offset with respect to the elements in another one of the layers along the at least two orthogonal measurement directions across the lattice of elements, and
each element in one of the layers at least partially overlaps a corresponding element in another one of the layers in the single diagonal direction across the lattice of elements,
wherein an overlay estimation for each of the at least some of the SCOL targets is derivable from measurements of differential signals in the at least two orthogonal measurement directions and the single diagonal direction of each of the at least some of the SCOL targets.

7. A metrology measurement method comprising:
measuring differential signals from a scatterometry overlay (SCOL) target, wherein the SCOL target comprises a single cell with a lattice of elements including at least at two layers wherein:
the lattice is periodic along at least two orthogonal measurement directions and a single diagonal direction,
the elements in one of the layers are offset with respect to the elements in another one of the layers along the at least two orthogonal measurement directions across the lattice of elements, wherein the differential signals are measured simultaneously along the at least two orthogonal measurement directions, and
each element in one of the layers at least partially overlaps a corresponding element in another one of the layers in the single diagonal direction across the lattice of elements,
wherein the differential signals are measured in the at least two orthogonal measurement directions and the single diagonal direction; and
deriving one or more overlay estimations along the at least two orthogonal measurement directions and the single diagonal direction from the measured differential signals.

8. The method of claim 7, wherein the overlay estimations are derived according to:

$$\varepsilon_y = \frac{D_x D_{xy} - D_x D_{\overline{xy}} - D_y D_{xy} - D_y D_{\overline{xy}}}{D_{xy} D_y + D_y D_{\overline{xy}} - D_x D_{xy} + D_x D_{\overline{xy}}} f_0$$

$$\varepsilon_x = -\frac{D_x D_{xy} - D_x D_{\overline{xy}} + D_y D_{xy} - D_y D_{\overline{xy}}}{D_{xy} D_y + D_y D_{\overline{xy}} - D_x D_{xy} + D_x D_{\overline{xy}}} f_0$$

where $\varepsilon_x$ and $\varepsilon_y$ denote overlays along the measurement directions, $D_x$, $D_y$, $D_{xy}$, $D_{\overline{xy}}$ denote measured differential signals along respective directions and $f_0$ denotes the offset between the elements at the two layers.

9. The method of claim 7, wherein the at least two orthogonal measurement directions comprise at least three lattice vectors.

10. The method of claim 7, wherein the elements are arranged with corresponding pitches and offsets.

11. The method of claim 7, wherein one or more pitches of the elements along the at least two orthogonal measurement directions are equal.

12. The method of claim 7, wherein the differential signals are simultaneously measured in the at least two orthogonal measurement directions and the single diagonal direction.

13. The method of claim 7, wherein the elements are 10 μm or smaller.

14. A system comprising:
a controller, the controller including one or more processors and memory, the memory storing program instructions configured to cause the one or more processors to:
measure differential signals from a scatterometry overlay (SCOL) target, wherein the SCOL target comprises a single cell with a lattice of elements including at least at two layers wherein:
the lattice is periodic along at least two orthogonal measurement directions and a single diagonal direction,
the elements in one of the layers are offset with respect to the elements in another one of the layers along the at least two orthogonal measurement directions across the lattice of elements, wherein the differential signals are measured simultaneously along the at least two orthogonal measurement directions, and
each element in one of the layers at least partially overlaps a corresponding element in another one of the layers in the single diagonal direction across the lattice of elements,
wherein the differential signals are measured in the at least two orthogonal measurement directions and the single diagonal direction; and
derive one or more overlay estimations along the at least two orthogonal measurement directions and the single diagonal direction from the measured differential signals.

15. The system of claim 14, further comprising a metrology sub-system including one or more sensors, wherein the controller is communicatively coupled to the one or more sensors of the metrology sub-system.

16. The system of claim 14, wherein the at least two orthogonal measurement directions comprise at least three lattice vectors.

17. The system of claim 14, wherein the elements are arranged with corresponding pitches and offsets.

18. The system of claim 14, wherein one or more pitches of the elements along the at least two orthogonal measurement directions are equal.

19. The system of claim 14, wherein the differential signals are simultaneously measured in the at least two orthogonal measurement directions and the single diagonal direction.

20. The system of claim 14, wherein the elements are 10 μm or smaller.

* * * * *